US005416439A

United States Patent [19]

[11] Patent Number: 5,416,439
[45] Date of Patent: May 16, 1995

Shou et al.

[54] ANALOG CALCULATING

[75] Inventors: Guoliang Shou; Weikang Yang; Sunao Takatori; Makoto Yamamoto, all of Tokyo, Japan

[73] Assignee: Yozan, Inc., Tokyo, Japan

[21] Appl. No.: 174,065

[22] Filed: Dec. 28, 1993

[30] Foreign Application Priority Data

Dec. 28, 1992 [JP] Japan .......... 4-361703

[51] Int. Cl.$^6$ .......... H03K 17/00

[52] U.S. Cl. .......... 327/356; 327/360; 327/392

[58] Field of Search .......... 307/529, 362, 360, 246, 307/247.1, 592, 517, 597; 328/136, 137, 159, 160, 161; 377/47, 48, 49, 118, 121, 122

[56] References Cited

U.S. PATENT DOCUMENTS

| | | | |
|---|---|---|---|
| 3,947,697 | 3/1976 | Archer et al. | 307/247.1 |
| 4,251,776 | 2/1981 | Hansen | 328/160 |
| 4,276,615 | 6/1981 | Kuhnel | 365/45 |
| 5,187,631 | 2/1993 | Baylar et al. | 307/246 |
| 5,343,084 | 8/1994 | Gens | 307/246 |

OTHER PUBLICATIONS

Iwai, "The Beginning of Logical Circuit", Tokyo Denki Daigaku Shuppankyoku, pp. 75–76, 1980.

Wait, "Operational Amplifiers", The Electrical Engineering Handbook, pp. 625–631, 1993.

*Primary Examiner*—Timothy P. Callahan
*Assistant Examiner*—T. Lam
*Attorney, Agent, or Firm*—Cushman, Darby & Cushman

[57] ABSTRACT

An analog calculating circuit capable of storing data.

A calculating circuit according to the present invention converts an analog voltage level to a time value by using a charging voltage of an RC circuit and stores the time value as a number of clock cycles in a digital counter. The circuit then converts another voltage level to a second time value and either adds the second time value to or subtracts it from the first time value. This yields a time value corresponding to a multiplication or division, respectively, of the analog voltage levels.

2 Claims, 2 Drawing Sheets

ANALOG CALCULATING

FIELD OF THE INVENTION

This invention relates to an analog calculating circuit.

BACKGROUND OF THE INVENTION

In recent years, there have been arguments that analog computers should be considered because of the exponential increase in the cost of digital computer equipment concerning minute processing technology. However, a multivalued register or memory is needed to store the data inside an analog computer. Such means has not been realized yet.

SUMMARY OF THE INVENTION

The present invention solves the conventional problems associated with data storage in an analog computer. This is accomplished through the use of a calculating circuit capable of storing data.

A calculating circuit according to the present invention converts an analog voltage level to a time value by using a charging voltage of an RC circuit and stores the time value of the charging of the RC circuit as a number of clock cycles in a digital counter. The circuit then converts another analog voltage level to a second time value and either adds the second time value to or subtracts it from the first time value. This yields a time value corresponding to a multiplication or division, respectively, of the analog voltage levels.

PREFERRED EMBODIMENT OF THE INVENTION

Hereinafter an embodiment of a calculating circuit according to the present invention is described with referring to the attached drawings.

Figure 1:
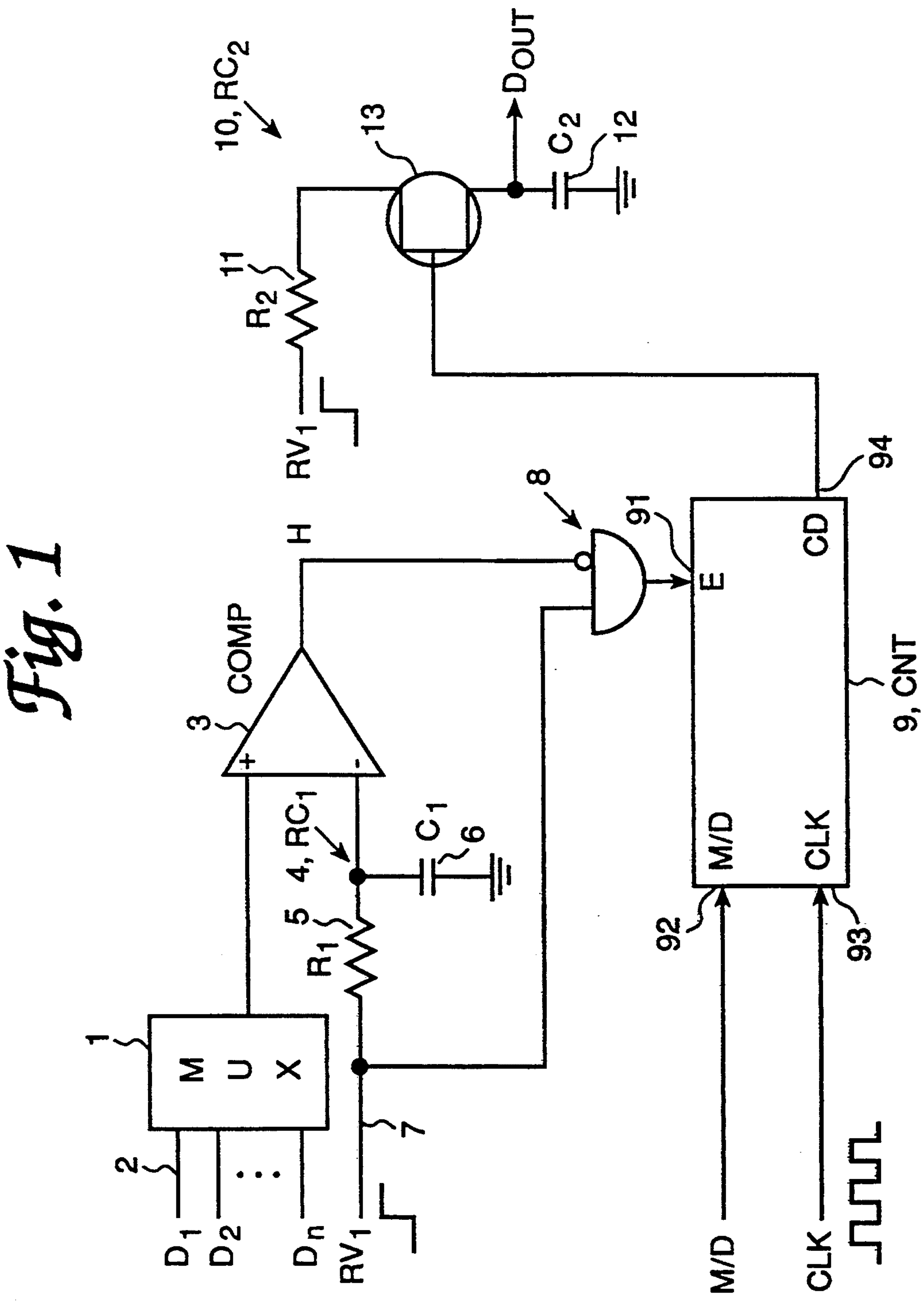
FIG. 1 is a circuit diagram showing the first embodiment of a calculating circuit relating to the present invention.

In FIG. 1, a calculating circuit has a multiplexer 1 selectively outputting analog data $D_k$ from analog lines 2 $D_1$ to $D_n$ to be utilized in the calculation. The output of multiplexer 1 is connected to a comparator 3 as a non-inverted input. The first RC circuit $RC_1$ 4 is connected with an inverted input of comparator 3 and a stepwise starting signal $RV_1$ applied at input line 7 is input to $RC_1$ 4. $RC_1$ 4 is composed of a resistance $R_1$ 5 connected at the first terminal with starting signal $RV_1$, and capacitance $C_1$ 6 connected at the first terminal with the second terminal of $R_1$ 5 and grounded at the second terminal. A juncture point of $C_1$ 6 and $R_1$ 5 is connected with an inverted input of comparator 3.

Comparator 3 provides an output of "0" when input ($D_k$-$RV_1$) is smaller than 0, and provides an output of active "1" when ($D_k$-$RV_1$) is more than 0.

An output of comparator 3 is input to an inverting input of logical AND gate 8 and starting signal $RV_1$ is input to a noninverting input of logical AND gate 8. The output of the logical AND gate 8 is input to a counter 9 as an enable signal E at enable input 91. The counter executes counting during a period from the time when starting signal $RV_1$ becomes "1" to the time when the output of comparator 3 becomes "1". Counter 9 has a multiplication/division switching signal M/D input 92, a clock CLK input 93 and count data CD output 94. The following signals definitions are predetermined:

TABLE 1

| |
|---|
| When M/D is equal to 1, then counter 9 is in an increment mode. |
| When M/D is equal to 0, then counter 9 is in a decrement mode. |
| Counter 9 is updated during a positive transition of CLK. |
| When a counter value of counter 9 is positive, then output CD is 1. |
| When a counter value of counter 9 is 0, then output CD in 0. |

When M/D is equal to 1, one of the analog data lines 2 $D_1$ to $D_n$ is selected as $D_k$ by multiplexer 1. $RV_1$ is defined as "1" and is input to the inverted input of comparator 3. The electric potential of inverted input of comparator 3 decreases as $C_1$ 6 is charged. When ($D_k$-$RV_1$) becomes "0", comparator 3 outputs a holding signal H of "1". $RV_1$ is also input to the gate 8 simultaneously to being input to $RC_1$ 4. Then counter 9 starts counting the number of cycles of clock signal CLK and increments the count value accordingly. CLK is a pulse of a predetermined frequency and the final count value of counter 9 corresponds to a time period from the time of inputting of a "1" value of $RV_1$ to the time when ($D_k$-$RV_1$) becomes "0".

Here, if the voltage of the inverted input of comparator 3 is defined as $V_{in}$ and time corresponding to $D_k$ is defined as $t_k$, then the following formulas are obtained:

$$V_{in}=RV_1\exp(-t_k/R_1C_1) \text{ and}$$

$$t_k=-R_1C_1 \log (D_k/RV_1)$$

When the first counting is complete, if a new analog line data $D_{k+1}$ is selected, M/D is set to "0" so that counter 9 will count down and $RV_1$ is equal to 1, then time $t_{k+1}$ corresponding to $D_{k+1}$ is subtracted from $t_k$ stored in counter 9. Time represented by the following formula is then stored in counter 9:

$$t_k-t_{k+1}=R_1C_1 \log \{D_kXD_{k+1}/(RV_1)^2\}$$

The formula shows a time corresponding to a division result of $D_k/D_{k+1}$. Storing the time as a count value is equivalent to holding the calculation result. As will be apparent to one skilled in the art, multiplication of $D_k$ and $D_{k+1}$ can be accomplished by setting M/D to "1" rather than "0" so that the times $t_k$ and $t_{k+1}$ are added rather than subtracted.

It is possible to perform the same calculation for any number of data, and it is possible to obtain a calculation result of all data from $D_1$ to $D_k$ as follows:

$$D_1^{p1} x\ D_2^{p2} x \ldots x\ D_n^{pn}$$

$$pk=1 \text{ or } -1$$

The second RC circuit $RC_2$ 10 with the same characteristics as $RC_1$ 4 is connected with CD output 94 in order to read a count value of counter 9. $RC_2$ 10 is composed of a resistance $R_2$ 11, one terminal to which starting signal $RV_1$ is applied, the other terminal being connected to transistor 13; and a capacitance $C_2$ 12 connected at the first terminal through transistor 13 and grounded at the second terminal. A gate of transistor 13 is connected with CD output 94. Assuming that M/D is equal to "0", a count value is decreased. When the count value is equal to "0", CD becomes "0" and transistor 13 is cut-off. $C_2$ 12 is charged during a period from the time $RV_1$ is equal to "1" to the time CD is equal to "0". The charged voltage of $C_2$ 12 at the final charging becomes an analog data $D_{out}$ corresponding to a total time. As a result, a calculation result of analog data is output.

Figure 2:
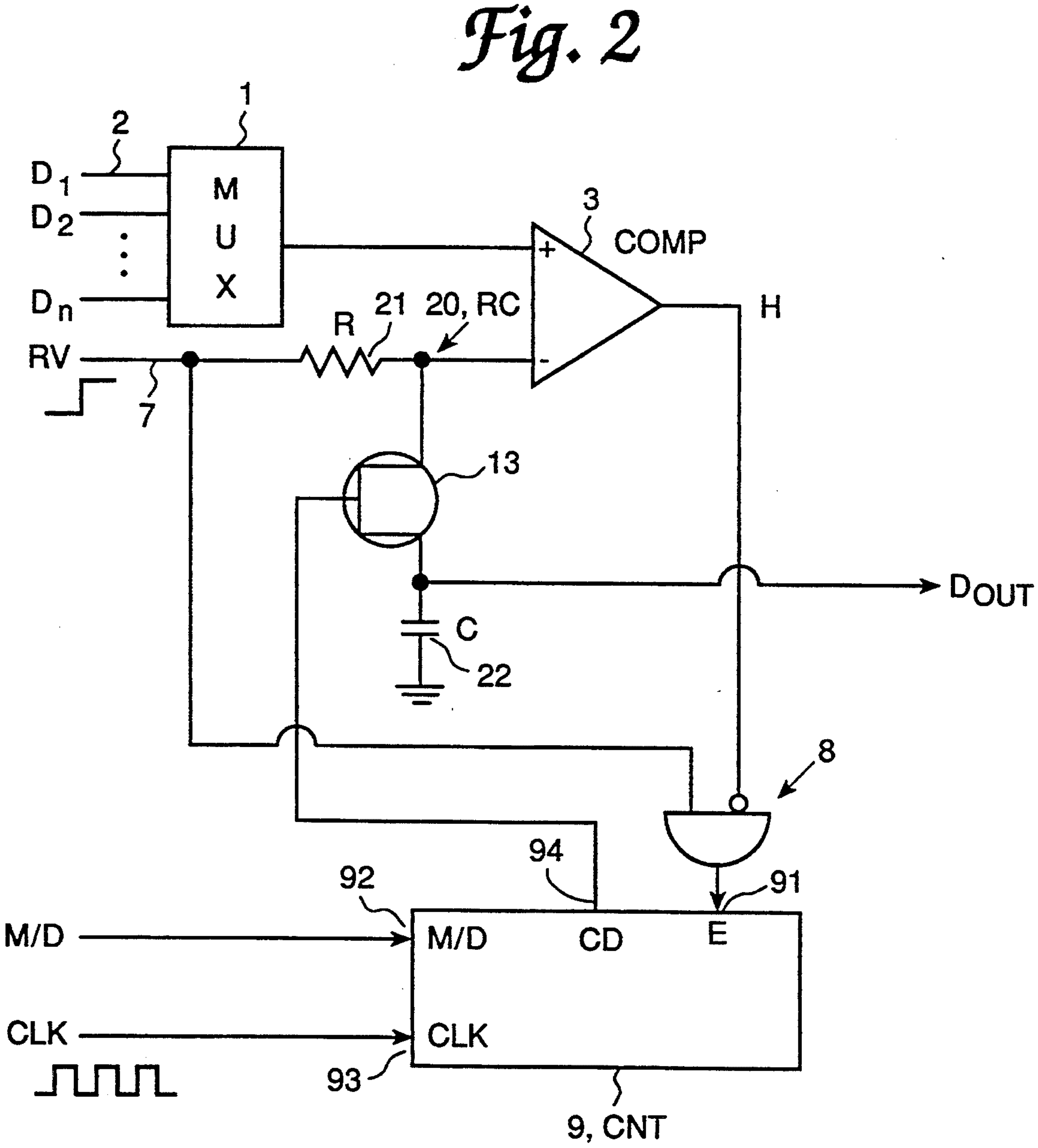
FIG. 2 is a circuit diagram showing the second embodiment of a calculating circuit relating to the present ivnention.

FIG. 2 shows the second embodiment in which the first and the second RC circuits 4 and 10 are a common circuit RC 20, composed of resistor R 21 and capacitor C 22.

Under the condition that CD is equal to "1" and transistor 13 is conductive, when RV becomes "1", C 22 is charged through R 21 and transistor 13. When counting is complete after H becomes "1", a time corresponding to a data $D_k$ is added to the count value. When M/D is equal to "0", the count value is decreased. When the value becomes "0", CD is equal to "0". Then transistor 13 is cut-off and the charged voltage of C becomes an output analog data $D_{out}$.

In the second embodiment RC 20 is commonly used so that the calculation inaccuracy is prevented due to dispersion of performance of different parts in the same LSI.

As mentioned above, a calculating circuit according to the present invention converts voltage level to time by using charged voltage of an RC circuit and storing charging time as a number of clock cycles in a digital counter, so that it is possible to provide a calculation circuit capable of storing data.

What is claimed is:

1. A calculation circuit comprising:

i) a selector means connected with a plurality of input voltages for selectively outputting one of said input voltages;

ii) a first RC circuit with a resistance and a capacitance, said capacitance being connected with a first terminal of said resistance at a first terminal and with earth at a second terminal, provided with an output terminal at a junction between said resistance and said capacitance, provided with an input terminal at a second terminal of said resistance for receiving a stepwise start signal;

iii) a second RC circuit with a resistance and a capacitance, said capacitance being connected with a first terminal of said resistance at a first terminal and with earth at a second terminal, provided with an output terminal at a junction between said resistance and said capacitance, provided with an input terminal at a second terminal of said resistance for receiving said stepwise start signal;

iv) a comparator means for outputting a stop signal when a difference is more than a predetermined value between an output of said selector means and said first RC circuit;

v) a counter means for receiving said stepwise start signal, said stop signal and a reference clock with a predetermined frequency so as to count a number of pulses of said reference clock between said stepwise start signal and stop signal with increasing number or with decreasing number, said increasing number and decreasing number being alternatively selective; and vi) a switching means for disconnecting said resistance and said capacitance of said second RC circuit when said counter means outputs a count value of "zero" and otherwise for connecting said resistance and said capacitance.

2. A calculation circuit comprising:

i) a selector means connected with a plurality of input voltages for selectively outputting one of said input voltages;

ii) an RC circuit with a resistance and a capacitance, said capacitance being connected with a first terminal of said resistance at a first terminal and with earth a a second terminal, provided with an output terminal at a junction between said resistance and capacitance, provided with an input terminal at a second terminal of said resistance receiving a stepwise start signal;

iii) a comparator means for outputting a stop signal when a difference is more than a predetermined value between an output of said selector means and said RC circuit;

iv) a counter means for receiving said stepwise start signal, said stop signal and a reference clock with a predetermined frequency so as to count a number of pulses of said reference clock between said stepwise start signal and stop signal with increasing number or with decreasing number, said increasing number and decreasing number being alternatively selective; and v) a switching means for disconnecting said resistance and said capacitance of said RC circuit when said counter means outputs a count value or "zero" and otherwise for connecting said resistance and said capacitance.

* * * * *